(12) United States Patent
Huang et al.

(10) Patent No.: US 8,081,051 B2
(45) Date of Patent: Dec. 20, 2011

(54) EMI SUPPRESSOR HAVING BANDPASS FILTERING FUNCTION

(75) Inventors: Chao Yu Huang, Hsinchu (TW); Chin Chyuan Tsai, Hsinchu (TW)

(73) Assignee: Z-Com, Inc., Hsinchu (TW)

( * ) Notice: Subject to any disclaimer, the term of this patent is extended or adjusted under 35 U.S.C. 154(b) by 282 days.

(21) Appl. No.: 12/625,225

(22) Filed: Nov. 24, 2009

(65) Prior Publication Data

US 2011/0050355 A1 Mar. 3, 2011

(30) Foreign Application Priority Data

Aug. 25, 2009 (CN) .......................... 2009 1 0168801

(51) Int. Cl.
*H01P 1/203* (2006.01)
*H04B 3/28* (2006.01)
(52) U.S. Cl. .......................... 333/204; 333/238; 333/12
(58) Field of Classification Search ............ 333/12, 333/204, 205, 219, 238
See application file for complete search history.

(56) References Cited

U.S. PATENT DOCUMENTS

| | | | | |
|---|---|---|---|---|
| 3,343,069 A | * | 9/1967 | Tsuda | 307/424 |
| 3,875,538 A | * | 4/1975 | Minet et al. | 333/204 |
| 7,057,481 B2 | * | 6/2006 | Yeh | 333/204 |

* cited by examiner

*Primary Examiner* — Dean O Takaoka
(74) *Attorney, Agent, or Firm* — Muncy, Geissler, Olds & Lowe, PLLC

(57) ABSTRACT

An electromagnetic interference (EMI) suppressor having a bandpass filtering function is provided. The EMI suppressor is disposed on a substrate, and includes a signal line, a ground line, an open-circuit line, a first line group, and a second line group. The signal line has an input terminal and an output terminal for feeding in and feeding out electromagnetic wave signals respectively. One terminal of the ground line is connected to the signal line and the other terminal is a ground terminal. One terminal of the open-circuit line is connected to the signal line and the other terminal is an open-circuit terminal. The first line group is formed by a first open-circuit line and a second open-circuit line, and is connected to the signal line. The second line group is formed by a third open-circuit line and a fourth open-circuit line, and is connected to the signal line.

16 Claims, 2 Drawing Sheets

EMI SUPPRESSOR HAVING BANDPASS FILTERING FUNCTION

CROSS-REFERENCES TO RELATED APPLICATIONS

This non-provisional application claims priority under 35 U.S.C. §119(a) on Patent Application No. 200910168801.8 filed in China on 2009 Aug. 25, the entire contents of which are hereby incorporated by reference.

BACKGROUND OF THE INVENTION

1. Technical Field

The present invention relates to wireless communication, and more particularly to a suppressor having a bandpass filtering function.

2. Related Art

In recent years, breakthrough in wireless communication technology has contributed both considerable convenience and infinite business opportunities. Among others, the most popular and widely-used wireless communication technology is the 802.11b/g standard established by the Institute of Electrical and Electronics Engineers (IEEE). A working frequency of the IEEE 802.11b/g standard is 2.4 GHz. In a wireless communication circuit the filter is an essential and indispensable component. A main function of the filter is to maintain purity of a main frequency signal and remove signals that are not at the main frequency. For example, for the IEEE 802.11b/g standard, the main frequency is 2.4 GHz.

An ideal filter has the following features: a passband has no attenuation, but attenuation is infinitely great within a cutoff frequency, and that a jump of the passband and the cutoff frequency should be as steep as possible. In addition, a signal at the main frequency further carries a second harmonic at a frequency of 4.8 GHz and a third harmonic at a frequency of 7.2 GHz. The second harmonic and the third harmonic render the wireless communication circuit unable to satisfy the limitations and requirements of standards and regulations for the frequency bands.

The wireless communication product development trend is towards light, thin, short, and small products. A huge challenge in the filter design in the prior art is decreasing an area occupied by the filter while ensuring filter efficiency. Another aspect, electromagnetic interference (EMI), must also be considered seriously, as a wireless communication product is usually used outdoors. In order to avoid damage to elements in a wireless communication circuit due to an induction current caused by lightning, an EMI suppressor is often added in the wireless communication product to protect the elements in the wireless communication circuit. The EMI suppressor usually needs a large area to achieve a desirable anti-EMI effect. Therefore, maintaining a desirable effect of the EMI suppressor and decreasing an area of the EMI suppressor at the same time is a problem urgently awaiting a solution.

SUMMARY

In view of the aforementioned problems, the present invention provides an electromagnetic interference (EMI) suppressor having a bandpass filtering function. The EMI suppressor is disposed on a substrate, and includes a signal line, a ground line, an open-circuit line, a first line group, and a second line group. The signal line has an input terminal and an output terminal for feeding in and feeding out electromagnetic wave signals respectively. One terminal of the ground line is connected to the signal line and the other terminal is a ground terminal. One terminal of the open-circuit line is connected to the signal line and the other terminal is an open-circuit terminal. The first line group is formed by a first open-circuit line and a second open-circuit line, and is connected to the signal line. The second line group is formed by a third open-circuit line and a fourth open-circuit line, and is connected to the signal line.

In the present invention, a bandpass filter capable of suppressing a second harmonic and a third harmonic is integrated in an electromagnetic interference (EMI) suppressor, so as to greatly reduce the required cost and area.

BRIEF DESCRIPTION OF THE DRAWINGS

The present invention will become more fully understood from the detailed description given herein below for illustration only, and thus are not limitative of the present invention, and wherein.

DETAILED DESCRIPTION

Figure 1:
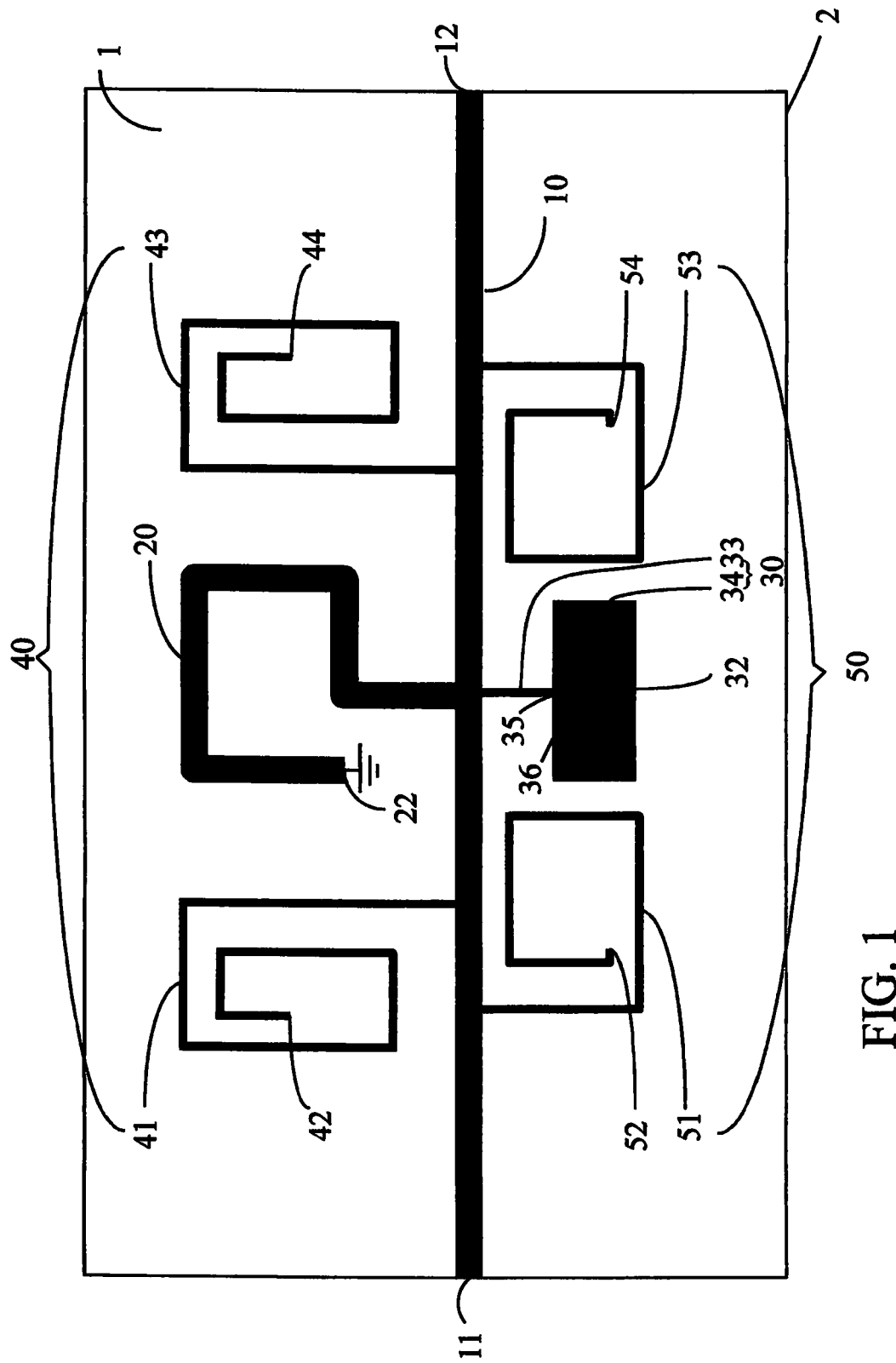
FIG. 1 shows an embodiment of the present invention.

FIG. 1 shows an embodiment of the present invention. A suppressor 1 having a bandpass filtering function is disposed on a substrate 2, and includes a signal line 10, a ground line 20, an open-circuit line 30, a first line group 40, and a second line group 50.

The signal line 10 has an input terminal 11 and an output terminal 12 for feeding in and feeding out electromagnetic wave signals respectively. An impedance of the input terminal 11 and the output terminal 12 is 50 Ohm. In this embodiment, one terminal of the ground line 20 is connected to a center position of the signal line 10, and the other terminal of the ground line 20 is a ground terminal 22. The ground line 20 is a spiral ground line, so as to decrease an occupied area. The ground terminal 22 is a terminal folded within the spiral ground line.

One terminal of the open-circuit line 30 is connected to a center position of the signal line 10, and the other terminal of the open-circuit line 30 is an open-circuit terminal 32. The open-circuit line 30 and the ground line 20 are disposed at different sides of the signal line 10. The open-circuit line 30 further includes a first residue segment line 33 and a second residue segment line 34. One terminal of the first residue segment line 33 is connected to the signal line 10 and the other terminal of the first residue segment line 33 is a first residue segment connecting terminal 35. One terminal of the second residue segment line 34 is a second residue segment connecting terminal 36 connected to the first residue segment connecting terminal 35. A free terminal of the second residue segment line 34 is an open-circuit terminal 32. A width of the first residue segment line 33 is different from a width of the second residue segment line 34.

The first line group 40 has a first open-circuit line 41 and a second open-circuit line 43, and the first open-circuit line 41 and the second open-circuit line 43 are connected to the signal line 10. The first line group 40 and the ground line 20 are disposed at the same side of the signal line 10. A center position between the first open-circuit line 41 and the second open-circuit line 43 is a position of the ground line 20. The first open-circuit line 41 is a spiral open-circuit line, and the first open-circuit terminal 42 is a free terminal folded within the spiral open-circuit line. The second open-circuit line 43 is the spiral open-circuit line, and the second open-circuit terminal 44 is a free terminal folded within the spiral open-circuit terminal. The first open-circuit line 41 and the second open-circuit line 43 have approximately the same length and width.

The second line group 50 has a third open-circuit line 51 and a fourth open-circuit line 53, and the third open-circuit line 51 and a fourth open-circuit line 53 are connected to the signal line 10. The second line group 50 and the open-circuit line 30 are disposed at the same side of the signal line 10. A center position between the third open-circuit line 51 and the fourth open-circuit line 53 is a position of the open-circuit line 30. The third open-circuit line 51 is a spiral open-circuit line, and the third open-circuit terminal 52 is a free terminal folded within the spiral open-circuit line. The fourth open-circuit line 53 is a spiral open-circuit line, and the fourth open-circuit terminal 54 is a free terminal folded within the spiral open-circuit line. The third open-circuit line 51 and the fourth open-circuit line 53 have approximately the same length and width.

The first open-circuit line 41, the second open-circuit line 43, the third open-circuit line 51, the fourth open-circuit line 53, and the open-circuit line 30 are open-circuit transmission lines, which can suppress a second harmonic and a third harmonic based on their properties. The signal line 10, the first open-circuit line 41, the second open-circuit line 43, the third open-circuit line 51, the fourth open-circuit line 53, the ground line 20, and the open-circuit line 30 form the suppressor 1 having a bandpass filtering function.

The bandpass filtering function is determined by the length and width of the signal line 10, the first open-circuit line 41, the second open-circuit line 43, the third open-circuit line 51, the fourth open-circuit line 53, the ground line 20, and the open-circuit line 30. The first open-circuit line 41 and the second open-circuit line 43 have approximately the same length and width. The ground line 20 and the open-circuit line 30 are disposed at an approximate center position of the signal line 10.

The bandpass filtering function of the suppressor 1 is determined by the length and width of the signal line 10, the first open-circuit line 41, the second open-circuit line 43, the third open-circuit line 51, the fourth open-circuit line 53, the ground line 20, and the open-circuit line 30. The first open-circuit line 41, the second open-circuit line 43, the third open-circuit line 51, the fourth open-circuit line 53, and the ground line 20 are foldable transmission lines to effectively reduce an area occupied by the suppressor 1. Thus neither a clockwise folding direction, a counterclockwise folding direction, nor an angle of the folding direction, influences properties of the suppressor 1. The ground line 20 guides an induction current caused by the EMI to ground through the ground terminal 22, such that a rear terminal circuit connected to the output terminal 12 is not damaged by a high induction current.

Figure 2:
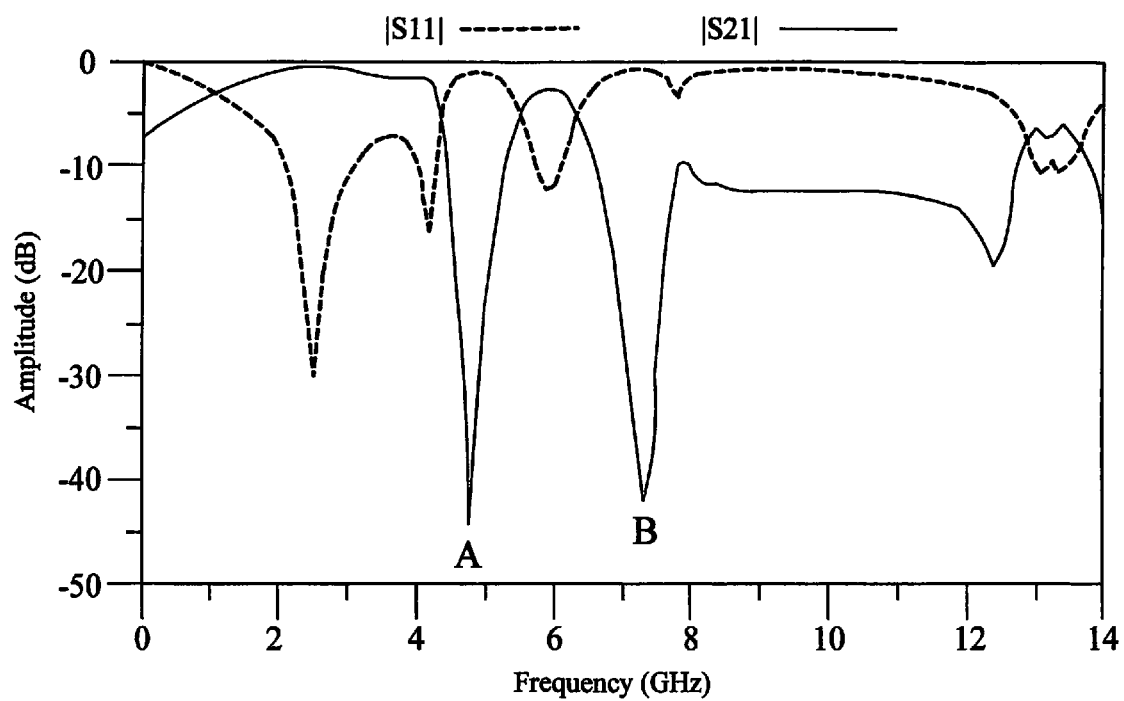
FIG. 2 is a test diagram of a bandpass filtering function of the present invention.

FIG. 2 is a test diagram of a bandpass filtering function of the present invention. In FIG. 2, a horizontal axis represents a frequency (unit: GHz) of a signal input from the input terminal 11, a vertical axis represents amplitude (unit: dB), and quadrants indicate an amplitude of a scattering parameter of transmission (S-parameter: S21) and an amplitude of a scattering parameter of reflection (S-parameter: S11). The scattering parameter of transmission (S21) represents a relation between an input power of a signal input from the input terminal 11 and an output power of a signal output from the output terminal 12, and the corresponding mathematical expression is as follows: output power/input power (dB)=20×Log|S21|.

During the signal transmission, a part of power of the signal is reflected back to a signal source. The power reflected back to the signal source is referred to as reflected power. A corresponding mathematical expression between the input power and the reflected power is as follows: reflected power/incident power (dB)=20×Log|S11|.

As can be seen in FIG. 2, the present invention has a desirable bandpass filtering function, and here the passband frequency is set to 2.4 GHz. For example, if an input signal at a frequency of 2.4 GHz is input from the input terminal 11, loss of the input signal within the passband frequency range approaches 0 dB. At the double frequency (4.8 GHz) and triple frequency (7.2 GHz), a first zero point A and a second zero point B can effectively suppress noises of the second harmonic and the third harmonic respectively.

At the same time, as can be seen from Curve S11, an absolute value of reflection loss of signals within the passband frequency range is greater than 10 dB, and an absolute value of reflection loss of signals outside the passband frequency is smaller than 10 dB. The bandpass filtering function is determined by length and width of the signal line 10, the first open-circuit line 41, the second open-circuit line 43, the third open-circuit line 51, the fourth open-circuit line 53, the ground line 20, and the open-circuit line 30. The first open-circuit line 41, the second open-circuit line 43, the third open-circuit line 51, the fourth open-circuit line 53, and the ground line 20 are spiral open-circuit lines, thereby reducing an occupied area of the present invention. Thus neither a clockwise nor counterclockwise folding direction with a folding angle of 90 degrees influences the properties of the suppressor 1.

While the present invention has been described by way of example and in terms of the preferred embodiments, it is to be understood that the invention need not to be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A suppressor having a bandpass filtering function, disposed on a substrate, comprising:
   a signal line, having an input terminal and an output terminal for feeding in and feeding out electromagnetic wave signals respectively;
   a ground line, having one terminal of connected to the signal line and the other end being a ground terminal;
   an open-circuit line, having one terminal connected to the signal line and the other end being an open-circuit end;
   a first line group, having a first open-circuit line and a second open-circuit line connected to the signal line; and
   a second line group, having a third open-circuit line and a fourth open-circuit line connected to the signal line.

2. The suppressor as claimed in claim 1, wherein the first open-circuit line, the second open-circuit line, the third open-circuit line, and the fourth open-circuit line are spiral open-circuit lines, and free terminals of the spiral open-circuit lines are a first open-circuit terminal, a second open-circuit terminal, a third open-circuit terminal, and a fourth open-circuit terminal.

3. The suppressor as claimed in claim 2, wherein the spiral open-circuit lines are folded in a counterclockwise direction.

4. The suppressor as claimed in claim 2, wherein the spiral open-circuit lines are folded in a clockwise direction.

5. The suppressor as claimed in claim 1, wherein the ground line is a spiral ground line, and the ground terminal is a terminal folded within the spiral ground line.

6. The suppressor as claimed in claim 5, wherein the spiral ground line is folded in a counterclockwise direction.

7. The suppressor as claimed in claim 5, wherein the spiral ground line is folded in a clockwise direction.

8. The suppressor as claimed in claim 1, wherein the open-circuit line further comprises:
    a first residue segment line, having one terminal connected to the signal line and the other terminal being a first residue segment connecting terminal; and
    a second residue segment line, having one terminal being a second residue segment connecting terminal connected to the first residue segment connecting terminal, and the other free terminal being the open-circuit terminal.

9. The suppressor as claimed in claim 8, wherein a width of the first residue segment line is different from a width of the second residue segment line.

10. The suppressor as claimed in claim 1, wherein the first open-circuit line and the second open-circuit line have approximately the same length and width.

11. The suppressor as claimed in claim 1, wherein the third open-circuit line and the fourth open-circuit line have approximately the same length and width.

12. The suppressor as claimed in claim 1, wherein the input terminal and the output terminal are matched based on an impedance of 50 Ohm.

13. The suppressor as claimed in claim 1, wherein one terminal of the ground line is connected to a center position of the signal line, and the other terminal is the ground terminal.

14. The suppressor as claimed in claim 1, wherein one terminal of the open-circuit line is connected to a center position of the signal line, and the other terminal is the open-circuit terminal, and the open-circuit line and the ground line are disposed at different sides of the signal line.

15. The suppressor as claimed in claim 1, wherein the first line group and the ground line are disposed at a same side of the signal line, and an approximate center position between the first open-circuit line and the second open-circuit line is a position of the ground line.

16. The suppressor as claimed in claim 1, wherein the second line group and the open-circuit line are disposed at a same side of the signal line, and a center position between the third open-circuit line and the fourth open-circuit line is a position of the open-circuit line.

* * * * *